United States Patent
Berner

(10) Patent No.: US 11,422,242 B2
(45) Date of Patent: Aug. 23, 2022

(54) METHOD AND EVALUATION UNIT FOR DETERMINING A TIME OF A FLANK IN A SIGNAL

(71) Applicant: JENOPTIK Optical Systems GmbH, Jena (DE)

(72) Inventor: Dirk Berner, Grosspuerschuetz (DE)

(73) Assignee: Jenoptik Optical Systems GmbH, Jena (DE)

(*) Notice: Subject to any disclaimer, the term of this patent is extended or adjusted under 35 U.S.C. 154(b) by 0 days.

(21) Appl. No.: 17/611,001

(22) PCT Filed: May 6, 2020

(86) PCT No.: PCT/EP2020/062591
§ 371 (c)(1),
(2) Date: Nov. 12, 2021

(87) PCT Pub. No.: WO2020/229265
PCT Pub. Date: Nov. 19, 2020

(65) Prior Publication Data
US 2022/0206126 A1      Jun. 30, 2022

(30) Foreign Application Priority Data
May 13, 2019   (DE) .................... 10 2019 112 447.6

(51) Int. Cl.
*G01S 7/4865*   (2020.01)
*H03M 9/00*   (2006.01)
(Continued)

(52) U.S. Cl.
CPC ............ *G01S 7/4865* (2013.01); *G01S 17/58* (2013.01); *H03K 5/1534* (2013.01); *H03M 9/00* (2013.01)

(58) Field of Classification Search
CPC .... G01S 7/4865; G01S 7/4866; G01S 7/4868; G01S 7/4915; G01S 7/4918; G01S 17/58; H03K 5/1534; H03M 9/00
See application file for complete search history.

(56) References Cited

U.S. PATENT DOCUMENTS

| 5,757,297 A | 5/1998 | Ferraiolo et al. |
| 7,199,751 B2 | 4/2007 | Mikami et al. |

(Continued)

FOREIGN PATENT DOCUMENTS

| CN | 107659392 A | 2/2018 |
| DE | 102011056963 B3 | 9/2012 |

(Continued)

OTHER PUBLICATIONS

Japanese Office Action dated May 18, 2022 in corresponding application 2021-567853.

*Primary Examiner* — Hai L Nguyen
(74) *Attorney, Agent, or Firm* — Muncy, Geissler, Olds & Lowe, P.C.

(57) ABSTRACT

The invention relates to a method for determining a time of a flank in a signal, wherein the method comprises a step of reading the signal and has a master clock rate for operating a digital evaluation unit for evaluating the time of the flank. The method also comprises a step of forming a data word representing the signal, using a deserializer of a SERDES cell, wherein the data word has a plurality of bits, and wherein a sampling clock rate is applied to the SERDES cell for sampling the signal, which sampling clock rate is higher than the master clock rate, wherein one flank or two flanks of the sampling clock rate are used for sampling the signal. Finally, the method comprises a step of determining the time of the flank in the signal using the data word and the master clock rate in the evaluation unit.

11 Claims, 4 Drawing Sheets

(51) Int. Cl.
*H03K 5/1534* (2006.01)
*G01S 17/58* (2006.01)

(56) References Cited

U.S. PATENT DOCUMENTS

| | | | |
|---|---|---|---|
| 7,460,062 | B2 | 12/2008 | Nakamura |
| 7,627,790 | B2 | 12/2009 | Frisch et al. |
| 8,098,787 | B1 | 1/2012 | Turudic |
| 8,265,902 | B1 | 9/2012 | Brady et al. |
| 10,185,032 | B2 * | 1/2019 | Stutz .................. G01S 17/10 |
| 10,527,650 | B2 * | 1/2020 | Montijo ............ G01R 13/0254 |
| 2005/0069031 | A1 | 3/2005 | Sunter et al. |
| 2009/0052600 | A1 | 2/2009 | Chen et al. |
| 2012/0176159 | A1 | 7/2012 | Webb, III et al. |
| 2012/0290885 | A1 | 11/2012 | Mobin et al. |
| 2013/0341518 | A1 | 12/2013 | Fries et al. |
| 2015/0358150 | A1 | 12/2015 | Meng |
| 2017/0254835 | A1 | 9/2017 | Montijo |

FOREIGN PATENT DOCUMENTS

| | | |
|---|---|---|
| JP | 2002221567 A | 8/2002 |
| JP | 2005351862 A | 12/2005 |
| JP | 2008032498 A | 2/2008 |

* cited by examiner

METHOD AND EVALUATION UNIT FOR DETERMINING A TIME OF A FLANK IN A SIGNAL

This nonprovisional application is a National Stage of International Application No. PCT/EP2020/062591, which was filed on 6 May 2020, and which claims priority to German Patent Application No. 10 2019 112 447.6, which was filed in Germany on 13 May 2019, and which are both herein incorporated by reference.

BACKGROUND OF THE INVENTION

Field of the Invention

The approach presented here relates to a method and an evaluation unit for determining a time of a flank in a signal. In particular, the approach presented here for measuring transit times, for example in the area of laser pulse transit time detection, can be used for a traffic monitoring system.

DESCRIPTION OF THE BACKGROUND ART

In conventional systems for transit time measurement, input signals are often sampled at an existing (slow) system clock rate. The use of a separate time measuring circuit for time measurement is also conceivable. The time measuring circuit can be implemented, for example, as an additional circuit (IC), which can determine the times of the level changes of input signals with a high degree of precision.

Sampling by means of a system clock rate leads to a low time resolution. It is conceivable to significantly increase the system clock rate, which, however, entails considerable disadvantages in programmable digital circuits, such as, for example, significantly longer place and route times, use of ICs with higher power consumption and higher current consumption, or can possibly not be realized.

The disadvantage of the time measuring circuits is their small number of channels, that they cause additional costs and that they require additional current and space in the circuit. A time measuring circuit can only evaluate a few flanks in a defined time and should furthermore be regularly calibrated. In programmable circuits, there are implementations of the time measurement using internal transit time elements. Implementation via internal transit time elements requires many resources for many input signals. The realization leads to greatly different results in implementation and to significant differential and integral non-linearities. The implementation can only be ported to other digital circuits with considerable effort. A design description at the lowest technology level with a variety of synthesis and implementation requirements, so-called constraints, is necessary. The methods described are highly complex and maintenance-intensive.

U.S. Pat. No. 8,098,787 B1 and US 2013/0341518 A1 disclose a method for determining a time of a flank in a signal. The method has a step of reading the signal and a master clock rate for operating a digital evaluation unit for evaluating the time of the flank. The method furthermore has a step of forming a data word representing the signal using a deserializer of a SERDES cell, wherein the data word has a plurality of bits, and wherein a sampling clock rate is also applied to the SERDES cell for sampling the signal, which sampling clock rate is higher than the master clock rate, wherein one flank or two flanks of the sampling clock rate are used for sampling the signal. Finally, the time of the flank in the signal is determined using the data word and the master clock rate in the digital evaluation unit.

SUMMARY OF THE INVENTION

Against this backdrop, the presented approach creates a possibility for improving the determination of the time of a flank in a signal.

A method for measuring a time of a flank in a signal is therefore presented, wherein the method comprises the following steps:

reading the signal and a master clock rate for operating a digital evaluation unit for evaluating the time of the flank;

forming a data word representing the signal using a deserializer of a SERDES cell, wherein the data word has a plurality of bits, and wherein a sampling clock rate is also applied to the SERDES cell for sampling the signal, which sampling clock rate is higher than the master clock rate, wherein one flank or two flanks of the sampling clock rate are used for sampling the signal; and determining the time of the flank in the signal using the data word and the master clock rate in the evaluation unit.

A time of a flank in a signal can be understood to mean, for example, a time of a level change or of a signal jump in the signal. Such a flank can represent, for example, the arrival of an expected signal so that the time of this flank can be used for evaluating a transit time of a signal. A deserializer can be understood to mean, for example, a component by means of which signals are sampled temporally on an individual signal line and the obtained sample values are each saved or stored in a block in a data word to be output in parallel. A SERDES cell can be understood to mean a component designed to transmit data words on an individual data line, wherein the individual components of the data words are read in parallel, converted from parallel to serial and transmitted serially over the data line, and then converted from serial to parallel again in order to be made available as received data words. In this case, such a SERDES cell operates at a sampling clock rate that is greater than a system clock rate/master clock rate used for the operation of an electronic circuit in order to be able to store these sampled values of the signal in the bits of the data word to be provided, and to determine therefrom the values to be transmitted serially via the data line. The step of determining can, for example, also be carried out using the sampling clock rate.

The approach presented here is based on the finding that SERDES cells or components of these cells that are already available can often be used in order to be able to determine precisely the times of flanks in signals with a high degree of precision. This takes advantage of the fact that SERDES cells of this type use a high sampling rate, which is usually higher than the system clock rate or master clock rate that is used to operate the electronic circuit or the evaluation unit, so that a temporal resolution of the time of the occurrence of the flank of the signal is possible that significantly exceeds the maximum temporal resolution when using the master clock rate. Specifically, the signal conducted on the data or signal line is fed to the input of the deserializer, which now generates a corresponding n-bit data word from this signal. In this case, the signal can be present as a digital signal. In a level change or signal jump as a flank in this signal, in which, for example, as a result of the occurrence of the flank, the state of the signal changes from a value of logic 0

("low") to a value of logic 1 ("high"), the time of this change, jump, or flank in the signal with the knowledge of the sampling clock rate and of the data word can be determined by ascertaining the digit in the data word at which the change or jump in the state or signal level was detected, wherein each position or digit in this data word corresponds to a period or a cycle of the sampling clock rate. It is also conceivable for two flanks, here as both flanks, i.e., the starting and end flanks, of the sampling clock rate to be used. By determining the periods or a cycle of the master clock rate and, when a flank, a jump or a level change in the signal occurs, also by determining the period or cycle of the sampling clock rate, a highly precise measurement of the time of the occurrence of the flank in the signal can thus take place. At the same time, such a possibility can be technically very easily implemented through the use of a component of the known SERDES cell, in particular, for example, also in digital circuits, such as FPGAs or ASICs.

According to the invention, in the step of forming a second data word representing the signal, this second data word is formed using a deserialization of a second SERDES cell, wherein the second data word has a plurality of bits, in particular wherein both flanks of the sampling clock rate are used for sampling the signal, wherein a second sampling clock rate, shifted by a predetermined phase angle in relation to the sampling clock rate, for sampling the signal is applied to the second SERDES cell, in particular wherein the second sampling clock rate is shifted by a phase angle of 90 degrees in relation to the sampling clock rate, and wherein, in the step of determining, the time is furthermore determined using the second data word. For example, the same signal can be fed in parallel to the deserializer of the SERDES cell and to the deserializer of the second SERDES cell. Such an embodiment offers the advantage of enabling a further increased precision of the determination of the time of the occurrence of the flank in the signal, since by using the sampling clock rate in the (first) SERDES cell and using the second, phase-shifted sampling clock rate in the second SERDES cell, a time of the occurrence of the flank in the signal can be determined, which lies within a period duration of the sampling clock rate, since such a time of the occurrence of the flank can be detected with a high degree of precision by the deserializer of the second SERDES cell.

According to the invention, in the step of determining, the values of the data word and of the second data word are combined, in particular alternately, into values of an overall word, wherein the time is furthermore determined using the overall word. Such an embodiment of the approach presented here offers the advantage of being able to determine the determined or measured time of the flank in the signal with very high accuracy by means of the values of the signal sampled at the phase-shifted sampling clock rates at the different positions of the overall word.

Advantageous is furthermore an embodiment of the approach proposed here, in which a synchronization of the sampling clock rate with the master clock rate takes place in the step of forming before the sampling clock rate is applied to the SERDES cell, in particular wherein the sampling clock rate and the master clock rate have been derived from a signal provided by a clock rate generator. Such an embodiment of the approach proposed here offers the advantage of a particularly simple determination of the time since the beginning of cycles of the sampling clock rate coincide with the beginning of cycles of the master clock rate so that the time of the occurrence of the flank in the signal can be determined by a simple addition of the period duration of the master clock rate and, depending on information in the data word, one or more period durations of the sampling clock rate.

According to a further embodiment of the approach proposed here, in the step of forming, a further data word representing the signal can furthermore be formed using a deserializer of a further SERDES cell, wherein the further data word has a plurality of bits, and wherein a further sampling clock rate is also applied to the further SERDES cell for sampling the signal, which sampling clock rate is higher than the master clock rate, and wherein the SERDES cell and the further SERDES cell are each sensitive to different signs of a level change in the signal. In this case, in the step of determining, the time of the flank in the signal can be determined in the evaluation unit using the further data word and the master clock rate in order to measure the time of the flank in the signal. For example, the sampling clock rate can be used as a further sampling clock rate. For example, the SERDES cell can be sensitive to rising flanks or level changes in the signal, while the further SERDES cell is sensitive to falling flanks or level changes in the signal. The signal can be, for example, fed in parallel to the SERDES cell and to the further SERDES cell. Such an embodiment of the approach proposed here offers the advantage of a further increase in the precision of determining a time of a flank in a signal since several possible occurring level changes in the signal can now be detected.

An embodiment of the approach proposed here in which, in the step of forming, the further SERDES cell is designed to output a further data word that has a bit number that differs from the bit number of the data word of the first SERDES cell, is also conceivable. Such an embodiment of the approach proposed here offers flexibility with respect to the precision of the determination of times of the flanks in a signal, wherein, depending on the requirement of the evaluation, for example, rising flanks or level changes in the signal can be detected with a different precision than falling flanks or level changes.

According to a further embodiment, in the step of forming, an additional data word representing the signal can also be formed using an additional SERDES cell, which has a plurality of bits, wherein an additional sampling clock rate shifted by a predetermined phase angle in relation to the sampling clock rate is applied to the additional SERDES cell for sampling the signal, in particular wherein the additional sampling clock rate is shifted in relation to the sampling clock rate by a phase angle of 90 degrees, and wherein, in the step of determining, the time is furthermore determined using the additional data word. For example, the second sampling clock rate can be used as the additional sampling clock rate. The signal can be fed, for example, in parallel to the further SERDES cell and to the additional SERDES cell. Such an embodiment can also be used to determine the time of the occurrence of a flank or of a level change with very high precision, in particular when determining the time of a falling flank.

Particularly advantageous is an embodiment of the approach proposed here, in which the signal is delayed, in particular adjustably delayed, in the step of reading before it is fed to at least one of the SERDES cells. Such an embodiment offers the advantage of being able to delay the signal as a function of technology used for the SERDES cell and/or of environmental influences so that as high a precision as possible of the determination of the time of the flank or of the level change in the signal is made possible.

In a particularly advantageous embodiment, a method for determining a transit time and/or a pulse width of a test signal can be implemented, wherein a time and/or times of a rising and/or a falling flank of a test signal to be transmitted and/or a time and/or times of a rising and/or a falling flank of a received test signal is measured using the steps of a variant of a method presented herein for determining a time of a flank in a signal, wherein, in a step of determining, the transit time is furthermore determined using the time of the rising and/or falling flank. Such an embodiment offers the advantage of a highly precise determination of the transit time of a signal, especially if an evaluation of the transit time is to be used as the basis of a measurement in fine proceedings or criminal proceedings or as a time measurement of electromagnetic signals in various media, such as air or liquids.

In this case, particular attention can be paid to an embodiment of the approach presented here, in which the transit time of a laser pulse of a traffic monitoring device is determined as a test signal. Such an embodiment offers the advantage of being able to sufficiently precisely detect very short transit times of a laser pulse running at the speed of light using the approach proposed here, in order to achieve a legally supportable measurement based thereon in the area of traffic monitoring.

The approach presented here furthermore creates an evaluation unit that is designed to carry out, control or implement the steps of a variant of a method presented here in corresponding devices. The object on which the invention is based can also be achieved quickly and efficiently by means of this embodiment variant of the invention in the form of an evaluation unit.

For this purpose, the evaluation unit can have at least one computing unit for processing signals or data, at least one memory unit for storing signals or data, at least one interface to a sensor or an actuator for reading sensor signals from the sensor or for outputting data signals or control signals to at least one communication interface for reading or outputting data that are embedded in a communication protocol. The computing unit can, for example, be a signal processor, a microcontroller, or the like, wherein the memory unit can be a flash memory, an EEPROM, or a magnetic memory unit. The communication interface can be designed to read or output data wirelessly and/or in a line-bound manner, wherein a communication interface that can read or output line-bound data can, for example, read these data electrically or optically from a corresponding data transmission line or output them into a corresponding data transmission line.

In the present case, an evaluation unit can be understood to mean an electrical device that processes sensor signals and as a function thereof outputs control signals and/or data signals. The evaluation unit can have an interface, which can be designed as hardware and/or software. In a hardware design, the interfaces can, for example, be part of a so-called FPGA or system ASIC, which includes a wide variety of the functions of the device. However, it is also possible that the interfaces are separate integrated circuits or consist at least in part of discrete components. In a software design, the interfaces may be software modules which, for example, are present on a microcontroller in addition to other software modules.

According to an advantageous embodiment of the approach presented here, the evaluation unit can be designed as a digital integrated circuit, in particular as a configurable digital integrated circuit. Such an embodiment offers the advantage of being able to use widely available components for implementing the approach proposed here, and of being able to concentrate them accordingly by technically simple means. At the same time, such an embodiment usually operates very rapidly and can thus be easily replaced as a hardware basis for carrying out the approach presented here.

Conceivable is also an embodiment of the approach presented here, in which at least one clock rate input connection is provided in order to feed the master clock rate and/or the sampling clock rate to the evaluation unit from outside the evaluation unit. Such an embodiment offers the advantage of being able to use an external clock rate source for the use of one or more of the different clock rates, said clock rate, for example, having a high precision with regard to jitter or the provision of high clock rate frequencies, which, for example, may not be sufficiently available with clock rate generators integrated in corresponding circuits.

Advantageous is also a computer program product or computer program with program code which can be stored on a machine-readable carrier or storage medium, such as a semiconductor memory, a hard disk memory, or an optical memory, and is used to carry out, implement, and/or control the steps of the method according to one of the embodiments described above, in particular if the program product or program is executed on a computer or an evaluation unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
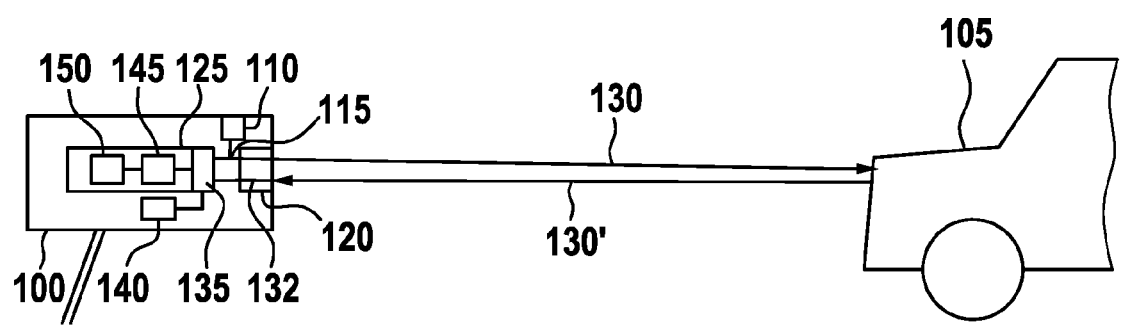
FIG. 1 a schematic illustration of a traffic monitoring device during the measurement of a speed of a vehicle with an evaluation unit according to an exemplary embodiment.

FIG. 1 shows a schematic illustration of a traffic monitoring device 100 when measuring a speed of a vehicle 105. The traffic monitoring device 100 is configured, for example, as a laser gun, which can be used by a policeman to monitor violations of a maximum permissible speed on a road section. In order to now determine this transgression of a maximum permissible speed by the vehicle 105, a trigger unit 110 in the traffic monitoring device 100 can output a start signal 115 to a laser unit 120 and to an evaluation unit 125 in order to control the laser unit 120 to output a laser pulse 130 and to provide the evaluation unit with information about the transmission of the laser pulse 130. For example, the laser unit 120 includes a laser diode, not shown in FIG. 1, that generates the laser pulse 130 and transmits it in the direction of the vehicle 105. At the same time, a time of the reception of the start signal can be detected in the evaluation unit 125 and a time measurement can be started. The laser pulse 130 is reflected at a surface of the vehicle 105, received again as a reflected laser pulse 130' in the laser unit 130 in the traffic monitoring device 100, and converted into a received signal 132 using a laser sensor not explicitly shown in FIG. 1, said received signal now also being fed to the evaluation unit 125. The start signal 115 and the received signal 132 can now be used in the evaluation unit 125 to determine a transit time of the laser pulse 130 from transmission by the laser unit 120 to reception of the reflected laser pulse 130', which can be used to determine the distance between the vehicle 105 and the traffic monitoring device 100 when the speed of light is known. For such a transit time measurement, the time of the arrival of the signal 130' is measured, wherein, initially, the received signal 132 representing the reflected laser pulse (which, for the sake of simplicity, is referred to in the following explanations only as a signal) is read in a reading interface 135, and a master clock rate for operating the digital evaluation unit for evaluating the time of the flank is read from a clock rate generator 140. The read information from the signal 132 is then used by a formation unit 145 to form a data word representing the signal 132 using a deserializer of a SERDES cell, wherein the data word has a plurality of bits, and wherein a sampling clock rate is also applied to the SERDES cell for sampling the signal, which sampling clock rate is higher than the master clock rate. Finally, the values formed in the formation unit 145 or the data word are fed to a determination unit 150 for determining the time of the flank in the signal 132 using the data word and the master clock rate in the evaluation unit, in order to measure the time of the flank in the signal 132. For a measurement of a current speed of the vehicle 105, the above procedure is repeated several times in succession so that, by determining the distances of the vehicle 105 from the traffic monitoring device 100 in each case, the speed of the vehicle 105 can be calculated when the time elapsed between the measurements is known.

In order to now enable a highly precise measurement of the speed of the vehicle 105 by the traffic monitoring device 100, a precise determination of the distance between the traffic monitoring device 100 and the vehicle 105 is required. This is due in particular to the fact that the measurements of the traffic monitoring device 100 are mostly used for imposing fines or initiating criminal proceedings when a transgression of speed regulations is detected, and thus high requirements are placed on their usability in court. Particular attention is therefore to be paid to the measurement of the time of the arriving received signal 132, which, due to the usually short distances between the traffic monitoring device 100 and the vehicle 105, is of central importance given a long transit time with the speed of light. As already stated at the outset, with some approaches, problems arise with regard to a simple implementation or higher implementation effort, which are reduced or eliminated by the procedure presented here.

For the time evaluation of flanks or signal jumps occurring in signals, at least one SERDES cell, or more precisely a deserializer of such a SERDES cell, can therefore be used, such as those that FPGAs have for rapid data transmission between two circuits on an assembly. Such cells convert an outgoing data stream of parallel data into serial data (SERializer) and an incoming data stream of serial data into parallel data (DESerializer), from which the name of the cells is also derived as SER(ializer)/DES(erializer) cell.

A SERDES cell as an input is a shift register, with which a serial input signal is sampled at a fast clock rate (sampling clock rate). The content of the shift register is output in parallel at a slower clock rate (master clock rate). A SERDES cell as the output is a shift register, which is loaded in parallel at a slow clock rate, and whose data are then output at the fast clock rate. Conversion can take place in common FPGA technologies in ratios of 1:4 to 1:14 bit. 1:4 means four parallel bits are converted to a serial line or vice versa. The frequency of the parallel data is multiplied for the serial data according to the conversion ratio. In order to once again double the clock rate ratio between serial and parallel data, it is possible to output or sample the serial data stream with both flanks of the fast clock rate. So-called double data rate flip-flops (DDR-FFs) are used.

In an evaluation unit, such as the evaluation unit 125 in FIG. 1, the time between two pulses and the pulse width can be measured on one signal in a circuit or FPGA. For the case initially described here, the pulses are positive. The pulse signals or the signal corresponding to the received signal 132 is initially digitized (for example, in the FPGA). For this purpose, the SERDES cells are used as deserializers. They convert the serial input signal into a multi-bit value and thus supply the content of the input shift register chain with the slow clock rate of the parallel data.

Figure 2:
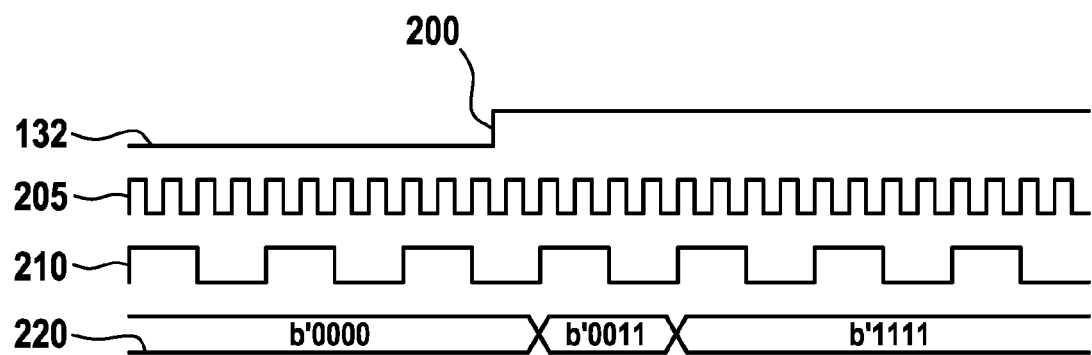
FIG. 2 a diagram with a plurality of signal curves for describing the principle mode of operation of the approach presented here.

FIG. 2 shows a diagram with a plurality of signal curves for describing the principle mode of operation of the approach presented here. In this connection, FIG. 2 shows a signal clearance for a deserialization ratio of 1:4. In FIG. 2, a signal curve is shown in which a signal jump or flank 200 takes place when a received signal 132 arrives, wherein this signal jump or flank 200 at a value of "Low" or logic 0 corresponds to a reflected laser pulse 130' that has not yet arrived, and the value of this signal jumps to the value of "High" or logic 1 when the reflected laser pulse 130' arrives at the laser unit 120. For the sake of simplicity, the signal corresponding to the reflected laser pulse 130' is denoted below by reference sign 132. The (fast) sampling clock rate 205 is shown in the partial diagram shown below it in the signal curve in FIG. 2 and the master clock rate 210 of the electronic circuit is shown in a further partial diagram below it. The bottom partial diagram of FIG. 2 shows a sequence of data words as obtained when the signal 132, the sampling clock rate 205, and the master clock rate are applied to a SERDES cell or the deserializer of a SERDES cell. From the data words 220, it can be seen that when a value of logic 0 is applied to the (serial) input of the deserializer, this value of logic 0 is sampled at the sampling clock rate and, for each sample value of the signal 132, a corresponding value of logic 0 is stored at the respective digit in the data word 220. Since the sampling clock rate corresponds to 4 times the master clock rate, the design of the deserializer is selected in such a way that a 4-bit wide data word is output, wherein the length of the data word is selected here only as an example, other lengths of the data word 220 can also be output by the SERDES cell or the deserializer of the SERDES cell, wherein a corresponding ratio between the sampling clock rate 205 and the master clock rate 210 is then also to be selected. It can also be seen from the illustration of the bottom partial diagram that no signal jump of the signal 132 is detected during the first two cycles of the master clock rate 210 so that the data word 220 respectively has the values "0000" and "0000".

During the third cycle of the master clock rate 210, a level change in the signal 132 can be seen in the uppermost partial diagram of FIG. 1, which level change is detected by the deserializer of the SERDES cell. When the signal 132 is sampled at the sampling clock rate 205, the signal jump or flank 200 from the value of logic 0 to the value of logic 1 between the second and third cycles of the sampling clock rate 205 is detected by the deserializer of the SERDES cell in the third cycle of the master clock rate 210 so that when the deserializer of the SERDES cell performs serial-to-parallel conversion to a 4-bit data word 220 in the third cycle of the master clock rate 210, a word of "0011" is output. In the subsequent master clock rates 210, in turn, when the signal 132 is sampled at the sampling clock rate 205, a signal jump is no longer detected so that a value representing the value of the signal 132 at each of the cycles of the sampling clock rate 205 is written to the respective digit of the data word 220 in each case, so that data words of "1111" are output at these times. Thus, when evaluating the time of a signal jump in the signal 132, the sampling clock rate 205 or cycles of the sampling clock rate 205, the master clock rate 210 or cycles of the master clock rate 210, and the respective data words 220 can be used to detect the time of the signal jump in the signal 132 with a high degree of precision; at least much more precisely than would be possible if the master clock rate 210 were used alone.

The parallel output data or the data words 220 are thus examined for level changes in order to detect a flank in the signal 132. The position of the level change in the parallel data includes the time information. This time information can be evaluated. With the aid of a rough counter, which operates at the slow clock rate of the master clock rate 210 of the parallel data and counts the cycles of the master clock rate 210 at a known period duration of the master clock rate 210, the time of the occurrence of a level change can be determined. At the same time, however, the period duration of the sampling clock rate 205 should also be known since it should be used to determine the time of the flank 200 within a period duration of a master clock rate 210 by means of the position of the signal value change in the data word 220.

Figure 3:
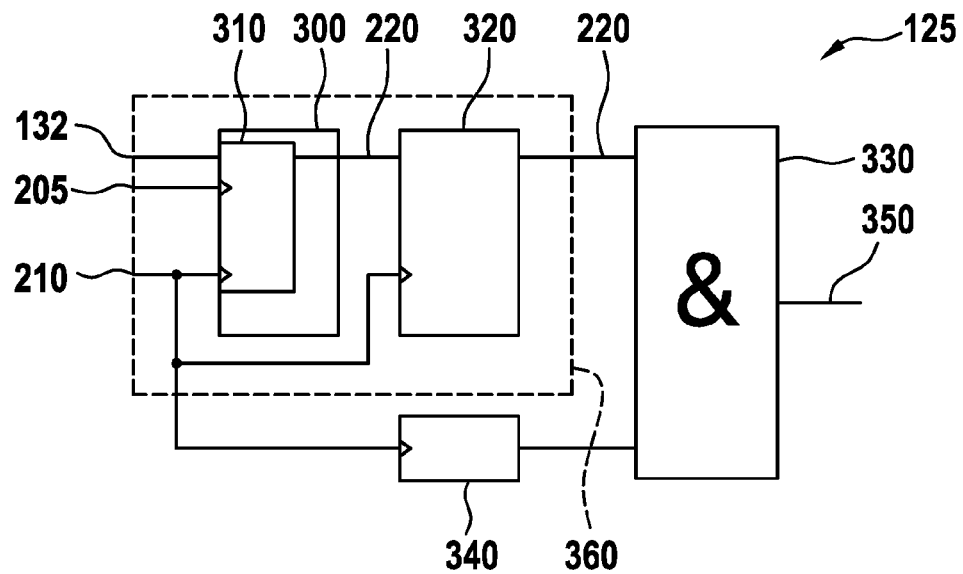
FIG. 3 a block diagram of a basic structure of an evaluation unit according to an exemplary embodiment for time measurement in a very simple form.

FIG. 3 shows a block diagram of a basic structure of an evaluation unit 125 for time measurement in a very simple form. In this case, the signal 132, the sampling clock rate 205 and the master clock rate 210 are fed to a SERDES cell 300, especially to the deserializer 310 of the SERDES cell 300, which then determines the data words 220 and feeds them to a flank evaluation unit 320, to which the master clock rate 210 is likewise fed. In the flank evaluation unit 320, it is now detected that a signal jump or flank 200 was contained in the signal 132 in accordance with the illustration of FIG. 2 so that the data words 220 can be passed on to a time determination unit 330, in which, taking into account a number of past cycles of the master clock rate determined in a rough counter 340 and from the position of a change in the values in the data word 220, time information or the time 350 of the occurrence of the flank 200 or the signal jump in the signal 132 can be determined. In this case, the time resolution of the evaluation unit 125 corresponds to the period duration of the sampling clock rate 205.

The time 350 of the occurrence of the flank 200 in the signal 132 is determined for each flank 200 by means of the SERDES cell 300 or the deserializer 310 of the SERDES cell 300, of the flank evaluation unit 320 (which together form a channel 360) and of the rough counter 340. The output of the flank evaluation unit 320 together with the rough counter 340 results in input data for determining the time information with a time resolution of the fast clock rate or sampling clock rate 205, which is, for example, synchronous with the slow clock rate or master clock rate 210.

In order to increase the time resolution, in a further exemplary embodiment, the SERDES cell 300 or the deserializer 310 of the SERDES cell 300 can operate with both flanks of the sampling clock rate 205 so that the time resolution of the evaluation unit 125 is doubled. The bit width of the data words 220 is thereby likewise doubled.

In a further exemplary embodiment, two SERDES cells or their deserializers can be used per input signal 132 in order to increase the resolution. The second SERDES cell or its deserializer is operated at a fast clock rate shifted by 90°, i.e., sampling clock rate 205. The slow clock rate (i.e., the master clock rate 210) of the second SERDES cell is shifted, for example, according to the deserialization ratio (1:n→90°/n). With this structure, the possible time resolution of the evaluation unit 125 is doubled once again if the SERDES cells operate with both flanks of the respective sampling clock rate.

Figure 4:
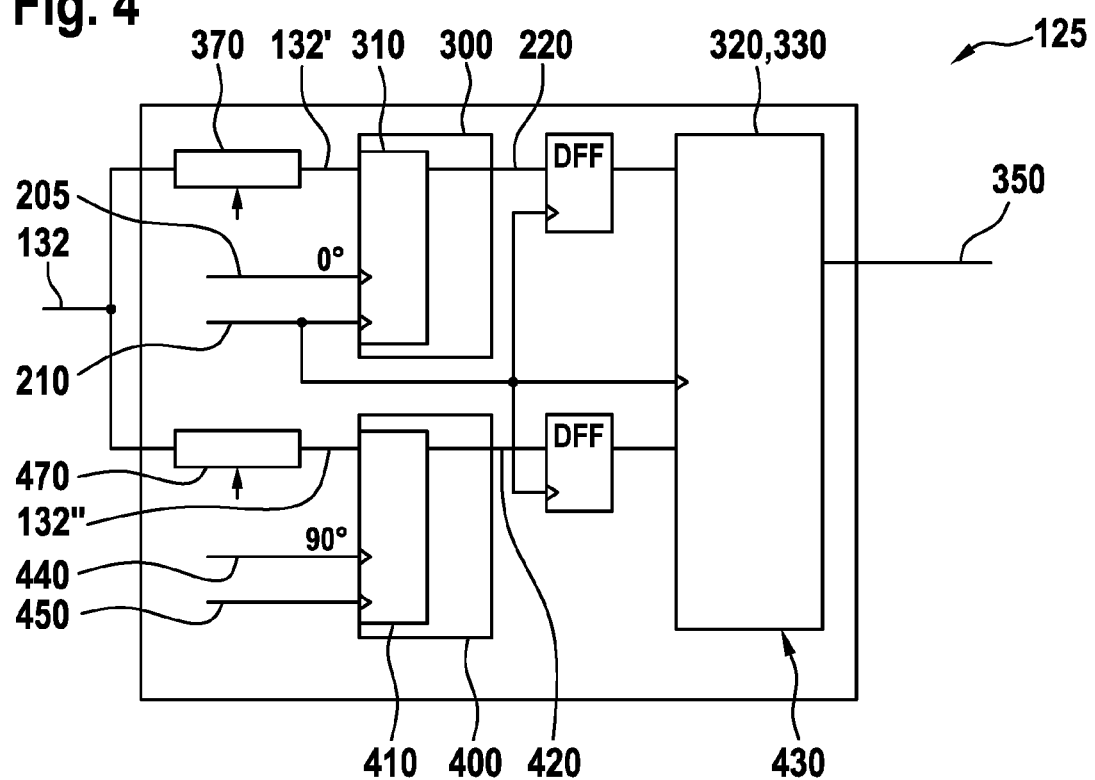
FIG. 4 a block diagram of a variant of an evaluation unit according to an exemplary embodiment using two SERDES cells.

FIG. 4 shows a block diagram of such a variant of an evaluation unit 125 using two SERDES cells, i.e., one SERDES cell 300 and one second SERDES cell 400, to each of which is applied the signal 132 (in a parallel signal feed). In order to be more accurate, the signal 132 is applied to a second deserializer 410 of the second SERDES cell 400. In this case, the structure and the wiring of the second SERDES cell 410 may correspond to the structure and wiring of the SERDES cell 300. The second SERDES cell 400 or the deserializer 410 of the second SERDES cell 400 then provides a second data word 420, which (together with the data word 220 provided by the deserializer 310) is fed to a combination unit 430, which implements the functions of the flank evaluation unit 320 and of the time determination unit 330 so that the information corresponding to the determined time 350 is output. In order to increase the time resolution of the time detection of the flank 200 in the signal 132, a second sampling clock rate 440 that is phase-shifted in comparison to the sampling clock rate 205 is applied to the second SERDES cell 400 or the second deserializer 410 of the second SERDES cell 400. This makes it possible to detect signal jumps or flanks 200 with a time resolution that is higher than the time resolution that can be achieved only with the sampling clock rate 205 alone using the rising and the falling clock rate flanks in the sampling clock rate 205. For example, the second sampling clock rate 440 can be phase-shifted by 90° with respect to the sampling clock rate 205. The second SERDES cell 400 or the second deserializer 410 can also be clocked at a second master clock rate 450 that is phase-shifted with respect to the master clock rate 210, in order to output the second data word 420. On the other hand, the result of the time evaluation in the combination unit 430 is synchronized, for example, with the unshifted slow clock rate, i.e., the master clock rate 210. With such a modification of the (measuring) channel 360 to an expanded (measuring) channel 460, a significant increase (doubling) of the time resolution of the time of an occurred signal jump or a flank 200 in the signal 132 can thus be achieved.

Furthermore, according to an optional exemplary embodiment, the data word 220 and/or the second data word 420 can also be temporarily stored before being fed into the combination unit 430 by means of (in each case) a D-flip-flop (DFF), which is/are clocked at the master clock rate 210. This ensures a simultaneous arrival of the data words 220 and 420 at the combination unit 430 so that undefined states on data lines at or in the combination unit can be avoided.

Furthermore, delay elements 370, 470, such as the IDELAY2 cell by Xilinx can be used to individually adjust a time delay in the ps range for each input signal or signal 132 prior to application to the deserializer 310, 410 of the SERDES cell 300, 400 in question. This results in signals 132' and 132", respectively, which differ from signal 132 in that they are individually delayed in time. Technology-related and/or environment-related unequal delays between the input of the signal 132 at the evaluation unit 125 and the sampling points of the deserializers 310, 410 are compensated with the individual delay of the signal 132. A maximum isochronous sampling of the signal 132 across all deserializers 310, 410 used is enabled, resulting in the minimization of differential and integral non-linearity of the evaluation unit 125 and the determined time points 350. The different behavior of the system with rising or falling flanks of the signal 132 can be corrected in an optimized manner for the rising, for the falling or for both flanks of the signal 132 by the individually adjustable delay elements 370, 470. Under certain circumstances, the optimized correction for both flanks of the signal produces a higher inaccuracy (differential or integral non-linearity) of the evaluation unit 125 than the optimization on a switching flank of the signal 132. When optimizing the correction on one switching flank of the signal 132, the measurement accuracy (differential or integral non-linearity) of the other flank of the signal 132 of the evaluation unit 125 is significantly reduced.

The resulting parallel output data or data words 220 or 420 are delayed by a slow 0° clock rate by the DFFs according to the system structure shown in FIG. 4 since the parallel output data 420 of the shifted SERDES cell 400 are synchronized to the unshifted clock rate (master clock rate 210). This structure could be doubled again and again in order to achieve even higher time resolutions of the evaluation unit 125. However, it has limiting parameters in (FPGA) technology. It must be ensured, for example, that all clock rates used are generated in one clock rate generator if possible, so that the jitter is identical in all clock rates. Furthermore, the clock rate generator should enable a correspondingly fine granular phase shift on the various output clock rates. Common FPGA technologies offer, for example, clock rate generators with up to eight clock rate outputs. It is also possible to generate the clock rates via an external clock rate generator. Then very close attention should be paid to the distribution and transit time of the clock rates on the circuit board and in the FPGA.

For example, for this purpose, both the sampling clock rate 205 and the master clock rate 210 can be generated by a clock rate generator (for example, the clock rate generator 140 of FIG. 1) that is not shown in FIG. 4 and is external to the evaluation unit 125, and the master clock rate 210 can be derived from the sampling clock rate. For example, a phase shift can also be carried out in the clock rate generator in order to obtain the second sampling clock rate 440 or the second master clock rate 450. Alternatively, such a provision of phase-shifted clock rates can also take place within the evaluation unit 125 by an appropriately designed phase-shift element.

With each further SERDES cell, for example, a further input pin is needed on the FPGA. The switching thresholds of each input pin are individual, i.e., each input pin switches for a rising flank or a falling flank at a different input voltage level and thus at a different time. This makes the differential non-linearity of the system more inaccurate. There is no longer an equal distribution of the time information. As already briefly stated above, this problem can be compensated through the use of the delay elements 370, 470, in which an individual adjustment of delays in the passing on of a correspondingly connected signal can be implemented.

In the design of the circuit board, care must be taken that all input pins are driven with switching flanks that are as steep as possible. Under certain circumstances, it is useful to capture the signal to be evaluated with an input pin on the FPGA and, via a 1:n multiplexer, asynchronously output it to n output pins (one pin per SERDES cell). These n output signals are directly fed back onto the input pins of the measuring stage on the circuit board. The output pins of the FPGA can generate very steep switching flanks and thereby minimize the behavior described above.

With any structure, care should be taken that the deserialization ratio is realized in a $2^n$ multiple in order to make the expansion of the rough counter as simple as possible.

Figure 5:
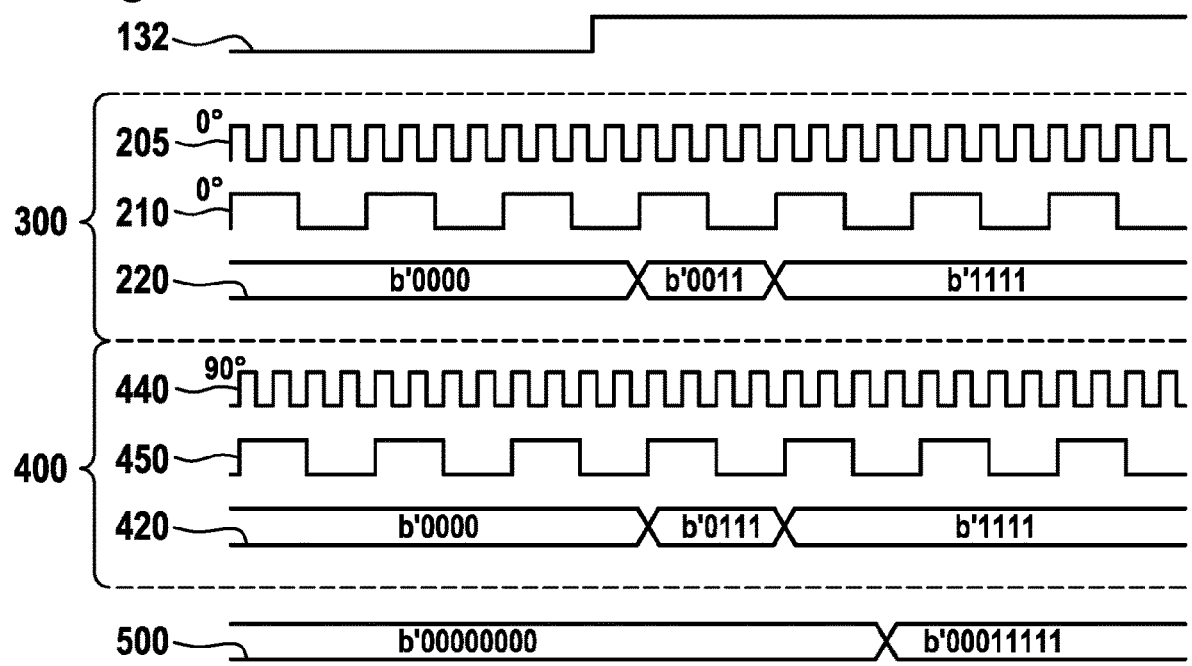
FIG. 5 a diagram with a plurality of signal curves for describing the principle mode of operation of the evaluation unit according to FIG. 4.

FIG. 5 shows a diagram with a plurality of signal curves for describing the principle mode of operation of the evaluation unit 125 according to FIG. 4. The uppermost partial diagram shows the signal curve of the signal 132, which is fed to the two SERDES cells 300 and 400. The three partial diagrams shown below it correspond to the signal curves of the sampling clock rate 205, the master clock rate 210 and the data words 220, as already described with reference to FIG. 2 for the (first) SERDES cell 300 according to the illustration of FIG. 3 (or of FIG. 4). In the following three further partial diagrams, the signal curves of the second (90° phase-shifted) sampling clock rate 440, of the second (phase-shifted) master clock rate 210 and of the data words 420 are now shown, as already described with reference to FIG. 4 for the second SERDES cell 400. It can be seen here that, in the third cycle of the second master clock rate 450, i.e., the phase-shifted master clock rate 450, the second data word 420 now no longer has the value "0011"; rather, it has the value "0111". This is attributable to the fact that the signal jump or flank 200 was now detected as having occurred slightly earlier by sampling at the second (i.e., the 90° phase-shifted) sampling clock rate 440 than by using the sampling clock rate 205. If the time of the occurred signal jump or flank 200 is now determined from the data word 220 and the second data word 420 in the combination unit 430, an alternating linking of the individual values of the data word 220 and the second data word 420 to an overall word 500 can, for example, be carried out for this purpose so that each digit of this overall word 500 represents a predefined past time period. In this manner, a highly precise determination of the time 350 of the occurrence of a flank 200 in the signal 132 can be achieved.

In order to now achieve a further improvement in the detection accuracy of the evaluation unit 125, the structure shown according to FIG. 4 can also be expanded again, as described in more detail with reference to FIG. 6.

Figure 6:
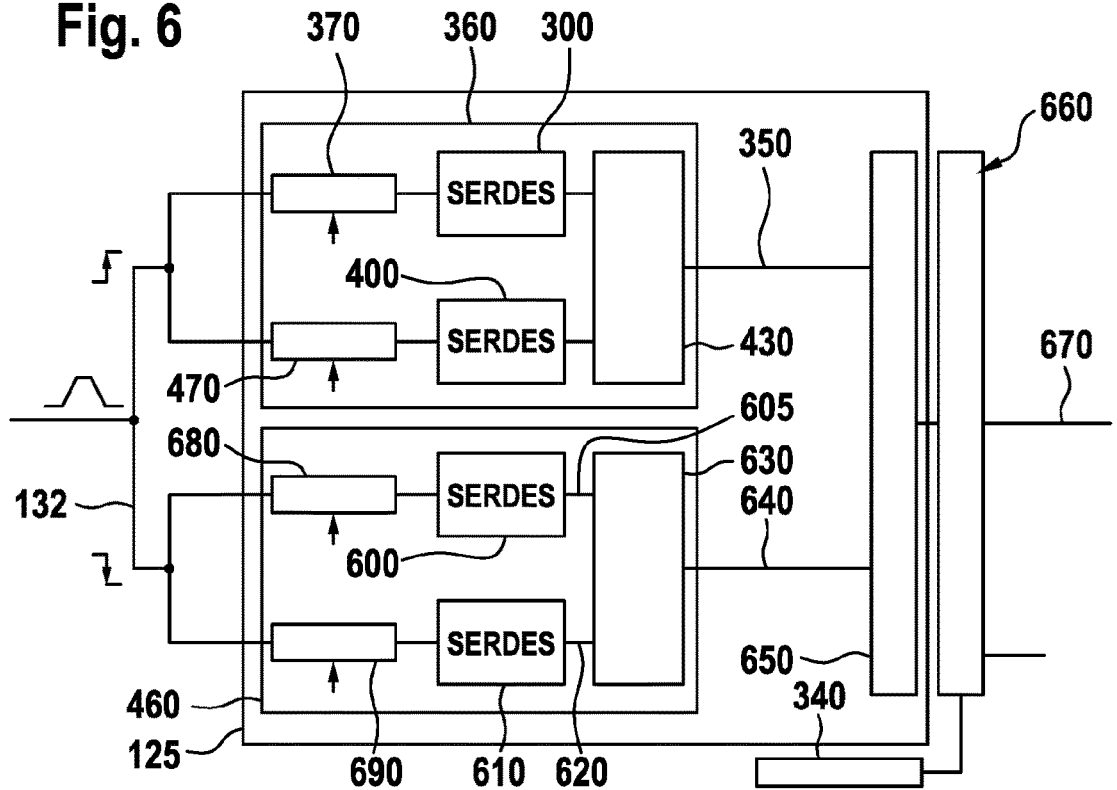
FIG. 6 a block diagram of a basic structure of an evaluation unit according to an exemplary embodiment for time measurement in an expanded form.

FIG. 6 shows a block diagram of a basic structure of an evaluation unit 125 according to an exemplary embodiment for time measurement in an expanded form. In contrast to the evaluation unit 125 of FIG. 4, for example, a further channel 460 can be provided, in which the SERDES cells are now sensitive to falling signal jumps or flanks 200, i.e., for example, a change in the signal 132 from a level of logic 1 to a level of logic 0. For this purpose, the further channel 460 can comprise a further SERDES cell 600, which corresponds to the flank sensitivity of the SERDES cell 300 and is likewise connected analogously to the signal 132, the sampling clock rate 205 and the master clock rate 210 in order to output further data words 605. In parallel, the further channel 460 can comprise an additional SERDES cell 610, which corresponds to the flank sensitivity of the second SERDES cell 400 and is likewise connected analogously to the signal 132, the second (phase-shifted) sampling clock rate 440 and the second (phase-shifted) master clock rate 450 in order to obtain additional data words 620. From the further data word 605 and the additional data word 620, a flank evaluation regarding the occurrence of a falling flank can then take place in a further combination unit 630 corresponding to the combination unit 430, and corresponding time information 640 can be sent to an overall flank evaluation unit 650, which can then detect a determination of a signal jump or flank 200 with either a rising signal flank or a falling signal flank. In a subsequent time determination unit 660, the relevant information about a time of the occurred flank 200 can then be undertaken, wherein, in turn, information from the rough counter 340 that provides a cycle number or a period duration of the master clock rate 210, in order to be able to thereby determine the time of the occurrence of the flank 200 in the signal 132 with a high degree of precision using the information from the data words 220, 420, 605 and/or 620. In order to adjust the transit times of the signals in a hardware circuit, in this exemplary embodiment as shown in FIG. 6, delay elements are used, as already described in relation to the exemplary embodiment of FIG. 4. The delay elements 370, 470 in the channel 360 (see FIG. 6) are, for example, adjusted in an optimized manner for rising flanks of the signal 132 and the delay elements 680, 690 in the channel 460 are, for example, adjusted in an optimized manner for falling flanks of the signal 132. A maximally accurate sampling of both flanks of the signal 132 is thereby achieved.

In summary, it can therefore be stated that, according to the approach presented here, time measurement takes place using deserializers of the digital circuits. In modern digital circuits, serializers/deserializers (SERDES) exist in the IO cells and can be used very well for the purposes presented here. Rapid data transmissions with a few lines are possible with the aid of these cells. For this purpose, parallel data are converted to serial in the serializer and output at a high bit rate. The deserializer receives the bit data stream and converts the data back into parallel words at lower speed. The deserializer samples an input signal at a very high clock rate. Such property is used for the time measurement. An input signal to be evaluated is applied to the input of one or more deserializers. This signal is sampled at the high deserialization clock rate and output in parallel at the output of the deserializer at the system clock rate. By using both flanks of the sampling clock rate in the deserializer and controlling the deserializers at phase-shifted sampling clock rates, a time resolution at a multiple of the sampling clock rate is achieved. The data stream of the deserializers can suitably be processed further. In parallel to the deserializer, there is a rough counter that operates at the system clock rate. This clock rate is furthermore resolved by the deserializer or deserializers according to their serial-to-parallel conversion and wiring, wherein the input stages of the input signal for a flank can also be optimized. This has the consequence that one or more input stages are used for sampling a signal in each case. In the flank evaluation, the correct time values for the rising or falling flank should be correctly taken into account.

The behavior of the circuit depends on the technology and environmental influences. In order to compensate the technology dependence, the circuit should be calibrated. The delay of the delay elements is, for example, dynamically changeable. The calibration in each IC or circuit used can thereby be adjusted individually. The influence of environmental factors can also be compensated via the dynamic change of the delay of the delay elements. Depending on the technology, this can be done during operation of the circuit, if necessary.

FIG. 6, described above, shows a possible structure for sampling an individual signal 132. Each individual channel with one SERDES cell or one deserializer each can be instantiated as often as desired depending on the technology. This further increases the granularity of the time resolution, until the technological limit is reached. The number of instantiations can be different for detecting the rising flank and the falling flank of the signal 132. The two flanks can thereby be detected with different resolution. Two input stages are used to determine the time information of a signal.

Depending on the technology, individual signal sampling can be used as often as desired in order to sample a plurality of signals. In each input stage of an individual signal sampling, the number of realized individual channels with one SERDES cell or one deserializer each is free. It can be individually defined for each detected individual signal. The flank times of the various signals are set in relation to one another in the time evaluation or output. Each individual channel is optimally calibrated for the respective flank to be detected. The calibration and configuration of the various delay elements takes place individually for each module and thus has the maximum flexibility. The configuration can be carried out in a technology-dependent manner regarding the transit time and can be updated on the basis of environmental influences.

The advantage of the approach presented here can be seen in the fact that many input signals can be sampled with an IC and measured relative to one another using digital circuits (e.g., programmable logic, FPGAs). Compared to separate time measuring circuits, the advantage consists in being able to evaluate many level changes in the input signals in a short period of time even between various input signals. A calibration is possible for compensating environmental influences. Since programmable digital circuits are frequently used in digital signal processing systems, time measurement is possible without further integrated circuits (ICs).

The approach presented here can thus be designed as a digital circuit, with the aid of which a digital input signal can be time-resolved in a very highly granular manner. The time resolution should be significantly above the maximum possible time resolution of the system clock rate (i.e., the master clock rate) and of the sampling clock rate of the digital circuit. When using the circuit, the distance between two flanks or the time of the flanks of an input signal can be determined. When two or more circuits are used for various input signals, the temporal intervals between the flanks of the input signals or the times of the flanks of the input signals can be determined. The inputs of the circuit can be explicitly optimized for rising and falling flanks so that the different technological detection of rising and falling flanks is compensated. Two circuits per input signal are to be used for detecting rising and falling signal flanks.

The determined measured values can be used, for example, for the transit time of light, such as the laser pulse 130, between the transmitter (taking into account a reflection on the vehicle) and the receiver. A distance can be determined thereby. The circuit can advantageously be implemented in programmable logic and/or user-specific circuits. For various sensor applications, it is favorable to measure the time between the flanks of digital input signals in digital electronic circuits and integrated circuits (ICs). In this case, the temporal relationships of the flanks in one or even between a plurality of input signals can be determined. The resolution over the system clock rate/master clock rate of the digital circuit is often too low, or the system clock rate of the digital circuit cannot or should not be increased in such a way as to achieve a corresponding temporal resolution. Therefore, a digital circuit that realizes a very high temporal resolution relative to the system clock rate/master clock rate should be designed. The circuit can be implemented, for example, in digital ICs (e.g., FPGAs) that are programmable once or multiple times and in user-specific ICs (e.g., ASICs).

Figure 7:
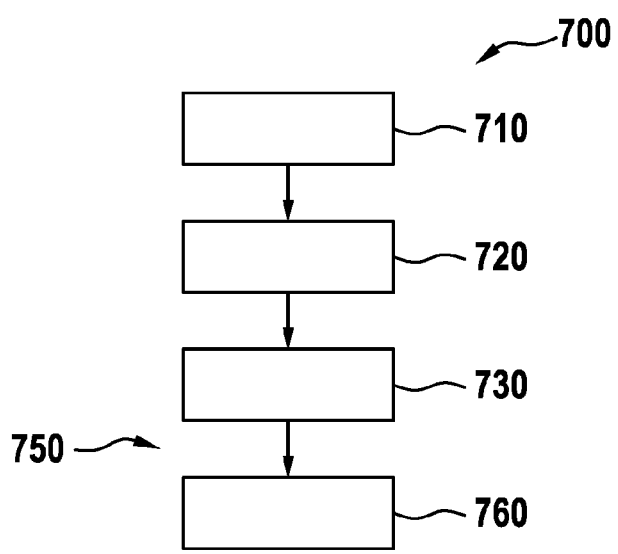
FIG. 7 a flow chart of an exemplary embodiment of the approach presented here as a method for measuring a time of a flank in a signal.

FIG. 7 shows a flow chart of an exemplary embodiment of the approach presented here as a method 700 for measuring a time of a flank in a signal. The method 700 comprises a step 710 of reading the signal and a master clock rate for operating a digital evaluation unit for evaluating the time of the flank. The method 700 furthermore comprises a step 720 of forming a data word representing the signal using a deserializer of a SERDES cell, wherein the data word has a plurality of bits, and wherein a sampling clock rate is also applied to the SERDES cell for sampling the signal, which sampling clock rate is higher than the master clock rate. Finally, the method 700 comprises a step 730 of determining the time of the flank in the signal in the evaluation unit using the data word and the master clock rate in order to measure the time of the flank in the signal.

In a further variant, a flow chart for a method 750 for determining a transit time of a test signal is presented, wherein a start time of a test signal to be transmitted and/or a reception time of a received test signal is measured using the steps of a variant of a method presented here for measuring a time of a flank in a signal, wherein the transit time is furthermore determined in a step 760 of determining using the start time and the reception time.

In summary, it can be noted that a simple high-resolution time measurement in the FPGA is possible by means of the approach presented here. In order to measure the rising and falling flanks of an input signal with similar quality, one measuring channel each, optimized for the measurement of the respective flank, can be implemented.

The use of delay elements was provided in an adjustable manner in the digital design. If necessary, the delay can therefore also be adjusted dynamically. This makes it possible to calibrate the measuring channels during operation. Compensation of parameters of the measuring channels specific to the assembly or environment is thus possible. In the approach presented here, only two channels were implemented. However, it is also conceivable to implement even more measuring channels.

If an exemplary embodiment comprises an "and/or" conjunction between a first feature and a second feature, this is to be read in such a way that the exemplary embodiment has both the first feature and the second feature according to one embodiment and either only the first feature or only the second feature according to a further embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. Method for determining a time of a flank in a signal, wherein the method comprises the following steps:

reading the signal and a master clock rate for operating a digital evaluation unit for evaluating the time of the flank;

forming a data word representing the signal using a deserializer of a SERDES cell, wherein the data word has a plurality of bits, and wherein a sampling clock rate is also applied to the SERDES cell for sampling the signal, which sampling clock rate is higher than the master clock rate, wherein one flank or two flanks of the sampling clock rate are used for sampling the signal; and determining the time of the flank in the signal using the data word and the master clock rate in the digital evaluation unit, characterized in that, in the step of forming a second data word representing the signal, this second data word is formed using a second deserializer of a second SERDES cell, which second data word has a plurality of bits, wherein a second sampling clock rate shifted by a predetermined phase angle in relation to the sampling clock rate, which sampling clock rate is higher than the master clock rate, is applied to the second SERDES cell for sampling the signal, wherein a second master clock rate shifted by a predetermined phase angle in relation to the master clock rate is applied to the second SERDES cell, and wherein, in the step of determining, the time is furthermore determined using the second data word and, in the step of determining, the values of the data word and of the second data word are combined alternately into values of an overall word, wherein the time is furthermore determined using the overall word.

2. Method according to claim 1, wherein, in the step of forming, a synchronization of the sampling clock rate with the master clock rate takes place before the sampling clock rate is applied to the SERDES cell, wherein the sampling clock rate and the master clock rate have been derived from a signal provided by a clock rate generator.

3. Method according to claim 1, wherein, in the step of forming, a further data word representing the signal is furthermore formed using a deserializer of a further SERDES cell, wherein the further data word has a plurality of bits, and wherein a sampling clock rate for sampling the signal is furthermore applied to the further SERDES cell, which sampling clock rate is higher than the master clock rate, and wherein the SERDES cell and the further SERDES cell are each sensitive to different signs of flank slopes in the signal, and wherein, in the step of determining, the time of the flank in the signal is determined in the evaluation unit using the further data word and the master clock rate in order to measure the time of the flank in the signal.

4. Method according to claim 3, wherein, in the step of forming, the further SERDES cell is designed to output a further data word that has a different bit number than the data word.

5. Method according to claim 3, wherein, in the step of forming, an additional data word representing the signal is formed using a deserializer of an additional SERDES cell, which additional data word has a plurality of bits, wherein an additional sampling clock rate, shifted by a predetermined phase angle in relation to the sampling clock rate, is applied to the additional SERDES cell for sampling the signal, and wherein, in the step of determining, the time is furthermore determined using the additional data word.

6. Method according to claim 1, wherein the signal is delayed in the step of reading before it is fed to at least one of the SERDES cells.

7. Method for determining a transit time and/or a pulse width of a test signal, wherein a time and/or times of a rising and/or a falling flank of a test signal to be transmitted and/or a time and/or times of a rising and/or a falling flank of a received test signal is determined using the steps of a method according to claim 1, wherein, in a step of determining, the transit time is furthermore determined using the time of the rising and/or falling flank.

8. Method according to claim 7, wherein the transit time of a laser pulse of a traffic monitoring device is determined as a test signal.

9. Evaluation unit for measuring a time of a flank in a signal, wherein the evaluation unit has devices, which are designed to carry out and/or control the steps of a method according to claim 1.

10. Evaluation unit according to claim 9, wherein the evaluation unit is designed as a digital integrated circuit.

11. Evaluation unit according to claim 10, wherein at least one clock rate input connection is provided in order to feed the master clock rate and/or the sampling clock rate to the evaluation unit from outside the evaluation unit.

\* \* \* \* \*